United States Patent
Garbuzov et al.

(10) Patent No.: US 6,330,263 B1
(45) Date of Patent: *Dec. 11, 2001

(54) LASER DIODE HAVING SEPARATED, HIGHLY-STRAINED QUANTUM WELLS

(75) Inventors: Dmitri Zalmanovich Garbuzov, Princeton; John Charles Connolly, Clarksburg; Viktor Borisovich Khalfin, Princeton; Hao Lee, Lawrenceville, all of NJ (US)

(73) Assignee: Sarnoff Corporation, Princeton, NJ (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/106,705

(22) Filed: Jun. 29, 1998

Related U.S. Application Data

(60) Provisional application No. 60/084,394, filed on May 6, 1998.

(51) Int. Cl.[7] .................................................. H01S 5/00
(52) U.S. Cl. ............................................ 372/45; 372/43
(58) Field of Search ............................ 372/45, 44, 43; 117/89

(56) References Cited

U.S. PATENT DOCUMENTS

| | | | |
|---|---|---|---|
| 5,048,036 | * | 9/1991 | Scifres et al. ........................ 372/45 |
| 5,075,743 | * | 12/1991 | Behfar-Rad .............................. 357/17 |
| 5,181,086 | * | 1/1993 | Yoshida ................................... 257/18 |
| 5,212,704 | * | 5/1993 | Chen et al. ............................. 372/46 |
| 5,216,684 | * | 6/1993 | Wang et al. ............................ 372/45 |
| 5,251,225 | * | 10/1993 | Eglash et al. .......................... 372/45 |
| 5,254,496 | * | 10/1993 | Briggs et al. ......................... 437/133 |
| 5,257,276 | * | 10/1993 | Forouhar et al. ...................... 372/45 |
| 5,537,433 | * | 7/1996 | Watanabe .............................. 372/45 |
| 5,625,635 | * | 4/1997 | Kurtz et al. ............................ 372/45 |
| 5,658,825 | * | 8/1997 | Razeghi ................................ 117/89 |
| 5,673,283 | | 9/1997 | Kajikawa et al. ..................... 372/46 |

FOREIGN PATENT DOCUMENTS 08-288586  *  11/1996  (JP) .

OTHER PUBLICATIONS

Nabarro, F.R.N., The Growth of Disclocation–Free Layers, *Dislocations in Solids,* 1983, vol. 6, Chapter 27, 122–125. (no month available).

Matthews, J. W. and Blakeslee, A. E., Defects in Epitaxial Multilayers, *Journal of Crystal Growth,* 1974, 27, 118–125. (no month available).

Matthews, J. W., Defects associated with the accommodation of misfit between crystals, *J. Vac. Sci. Technol.,* 1975, vol. 12, No. 1, 126–133. (Jan./Feb. 1975).

(List continued on next page.)

*Primary Examiner*—Teresa M. Arroyo
*Assistant Examiner*—Davienne Monbleau
(74) *Attorney, Agent, or Firm*—William J. Burke

(57) ABSTRACT

A semiconductor laser device with separated, highly-strained quantum wells employs highly-strained ternary and quasi-ternary compounds as material for each quantum well. A first device structure includes a quantum well composition range extended from strained ternary compounds employed in conventional quantum well laser devices. A second device structure, employing a similar structure to that of the first device, employs new quasi-ternary compounds with compositions outside of the miscibility gap of corresponding quaternary compounds for quantum wells in GaSb— or InAs-based laser devices which extend performance of mid-infrared laser devices operating in the 2.2–4.0 μm range. The semiconductor diode laser may be formed so as to operate having a multi-mode or single-mode radiation.

17 Claims, 5 Drawing Sheets

OTHER PUBLICATIONS

Garbuzov, D. Z., et al., 4 W quasi–continuous–wave output power from 2 μm AlGaAsSb/InGaAsSb single–quantum–well broadened waveguide laser diodes, *Appl Phys. Lett.,* 1997, vol. 70, No. 22, 2931–2933. (Jun. 2, 1997).

Garbuzov, D. Z., et al., Ultralow–loss broadened–waveguide high–power 2μm AlGaAsSb/InGaAsSb/GaSb separate–confinement quantum–well lasers, *Applied Physics Letters,* 1996, vol. 69, No. 14, 2006–2008. (Sep. 30, 1996).

Choi, H. K. and Eglash, S. J., High–power multiple–quantum–well GaInAsSb/AlGaAsSb diode lasers emitting at 2.1 μm with low threshold current density, *Appl. Phys. Lett.* 1992, vol. 61, No. 7, 1154–1156. (Sep. 7, 1992).

Garbuzov, D. Z., et al., High power separate confinement heterostructure AlGaAs/GaAs laser diodes with broadened waveguide, *SPIE,* 1996, 2682, 20–26. (no month available).

Garbuzov, D. Z., et al., "Broadened Waveguide, Low Loss 1.5μm IaGaAsP/InP and Zμm InGaAsSb/AlGaAsSb Laser Diodes" IEEE Conference on InP and Related Compounds, Hyannis, MA, May 11, 1997, pp 20–26.

Patent Abstracts of Japan vol. 1997, No. 3, Mar. 31, 1997—& JP 08 288586 A (Nec Corp), Nov. 1, 1996 the whole document.

Turner G W Et Al: "Ultralow–Threshold (50A/CM2) Strained Single–Quantum–Well GAINASSB/AIGAASSB Lasers Emitting at 2.05 MUM" Applied Physics Letters, vol. 72, No. 8, Feb. 23, 1998, pp. 876–878, XP000742780 ISSN: 0003–6951 the whole document.

PCT International Search Report corresponding to PCT Application PCT/US99/09872.

* cited by examiner

LASER DIODE HAVING SEPARATED, HIGHLY-STRAINED QUANTUM WELLS This application claims the benefit of the filing date of U.S. provisional application No. 60/084394, filed on May 6, 1998, as attorney docket no. SAR 12864P.

The present invention is directed to low threshold, continuous wave, semiconductor diode lasers, and, more particularly, to a diode laser having separated, highly-strained quantum wells.

BACKGROUND OF THE INVENTION

For many applications, it is desirable to employ a semiconductor laser that operates in the 2–5 micrometer ($\mu$m) range and provides a high output power. Typically, a semiconductor laser may be constructed of layers formed on a binary substrate, such as GaSb, InP, InAs or GaAs. While other substrate materials exist, these materials are commonly employed for substrates in the art. Some applications have employed semiconductor lasers having ternary compounds for the waveguide and active region, while other applications have employed quaternary compounds.

An important aspect of forming these layers in semiconductor lasers of the prior art is matching of a lattice constant of the layers of waveguide and active regions with the lattice constant of the substrate, which is normally a fixed value. Lattice matching avoids dislocations, or misfits, in crystal epitaxial layers.

For ternary compounds, the lattice constant depends on the composition, and if quantum well ternary material is lattice-matched with a waveguide region at a certain composition, the deviation from this composition leads to tensile or compressive strain of the ternary material. As is known in the art, a series of calculations derived by Matthews and Blakeslee may be used to calculate misfit dislocation concentration and critical strain for a pair of parallel crystal materials with different lattice constants that are placed in contact. These calculations are described in, for example, J. W. Matthews, J. Vac. Sci. Technol. 12, pages 126–133, 1975; J. W. Matthews, Dislocations in Solids, ed. F. R. N. Nabarro (Elsevier, New York, 1979), v.2, p461; and J. W. Matthews and A. E. Blakeslee, J. Crystal Growth, vol. 27, pages 118–125, 1974, and these articles are incorporated herein by reference for their teachings of misfit dislocation and critical strain calculation.

One III–V material is employed for the waveguide region and another is employed for the active region. As is known in the art, the active region may be a quantum well (QW) or multiple quantum wells (MQW). From the calculations described by Matthews and Blakeslee, one can find the critical value of the product $(f*h)_{crit}$, where h is the QW thickness, and f is the lattice mismatch between the QW and the adjacent waveguide region. When this product $(f*h)_{crit}$ is above a critical value, a dislocation-net is formed and laser performance degrades. At this critical value, the value of f is defined as $f_{crit}$. This dislocation-net formation limits the range of the QW compositions and the wavelength available for a given type of laser. Narrowing of QWs has not been shown to be a desirable method to solve these problems, since this approach limits the gain obtainable without saturation effects. In order to achieve gain sufficient to overcome losses, the Multi-Quantum Well (MQW) design may be preferable for many cases.

In the conventional version of separate confinement heterostructure multi-quantum well (SCH MQW) laser structure, the QWs are located in the central part of the waveguide at a distance of 10–20 nanometers (nm) from each other. In this case, the value $f_{crit}$ is determined by the sum of the QW thicknesses. The strain from each of the QWs adds together, thereby limiting the QW compositions considerably. For example, in the case of InGaAs MQWs grown on a GaAs substrate, the longer wavelength limit is about 1.1 $\mu$m and, for InGaAs MQWs grown on an InP substrate, this limit is about 2 $\mu$m.

Recent development of semiconductor diode lasers has demonstrated that the thickness of the waveguide region in single SCH-QW and SCH-MQW lasers may be increased to about 1 $\mu$m. As described in U.S. patent application Ser. No. 08/757883, filed Nov. 27, 1996 now U.S. Pat. No. 5,818,860, and entitled HIGH POWER SEMICONDUCTOR LASER, which is incorporated herein by reference, high output diode lasers having a waveguide region of 0.7 to 1.3 $\mu$m are shown to give satisfactory performance. Also, recent developments show that lasing may occur at wavelengths exceeding 2 $\mu$m by employing a MQW structure that is based on AlGaAsSb/InGaAsSb. Semiconductor lasers operating in the mid-infrared wavelength range and formed on binary substrates, such as GaSb or InAs, may use quaternary compounds such as GaInAsSb for the active region since these compounds allow lattice matching of the QW with the substrate under controlled strain. GaInAsSb includes a set of compounds with a lattice constant close to that of the GaSb and InAs, and having a bandgap corresponding to the wavelength range of 2–4 $\mu$m.

However, in multi-QW structures of the prior art, the quantum wells were not separated from each other or the cladding layers by a portion of the waveguide region having a thickness much greater than that of the thickness of the QW. This structure design attempts to reduce carrier leakage from the QWs, but at the expense of increased optical losses, since more than 90% of the lasing mode propagates in cladding layers with high free-carrier concentration.

Also, QW lasers with operating ranges of greater than 2.2 $\mu$m may be developed in a semiconductor laser system of AlGaAsSb/InGaAsSb with compositions of InGaAsSb QWs close to that of the lattice-matched compounds. These lasers have strain of less than 1% in QW. However, InGaAsSb quaternary compositions of these compounds are close to a miscibility gap. As a result, serious problems are encountered in growing high crystal quality lattice matched InGaAsSb compositions with In contents of more than 20%, which is needed for laser operation at wavelengths longer than 2.2-$\mu$m.

SUMMARY OF THE INVENTION

The present invention is directed to a semiconductor diode laser having at least one highly-strained quantum well, each quantum well disposed between first and second waveguide portions, each waveguide portion having a thickness at least double a thickness of the quantum well.

BRIEF DESCRIPTION OF THE DRAWING

The aforementioned features and benefits of the invention will be better understood from a consideration of the detailed description which follows taken in conjunction with the accompanying drawings, in which.

DETAILED DESCRIPTION

The present invention is directed to a semiconductor diode laser having at least one, and preferably two, highly-strained quantum wells. Each quantum well is disposed between first and second waveguide portions, with each waveguide portion having a thickness greater than a thickness of each quantum well and the thickness of each waveguide portion preferably at least one order of magnitude larger than that of the quantum well. In a first exemplary embodiment, a semiconductor laser is constructed in accordance with the present invention operating in the near-infrared wavelength range employing a ternary compound for each quantum well. The construction of the first exemplary embodiment may extend an operating range for the semiconductor laser compared to an operating range of semiconductor lasers of the prior art formed from such compounds. In a second exemplary embodiment, a semiconductor laser operating in the mid-infrared wavelength range is constructed in accordance with the present invention employing a highly-strained ternary or a quasi-ternary compound of new composition for each quantum well. The construction of the second exemplary embodiment may provide the semiconductor laser operating in the 2–4 $\mu$m range, which is greater than that of a semiconductor laser employing, for example, quaternary compounds with lattice matching. A third exemplary embodiment employs a single quantum well formed from a quasi-ternary compound.

Semiconductor diode lasers in accordance with the present invention include lasers having quantum well compounds with new compositions close to a miscibility gap, and quantum well compounds previously known but with an extended range of compositions available. Consequently, many different types of devices may be formed in accordance with the present invention, and these devices may either be multi-mode or single mode diode lasers operating or as employed in the art.

Figure 1:
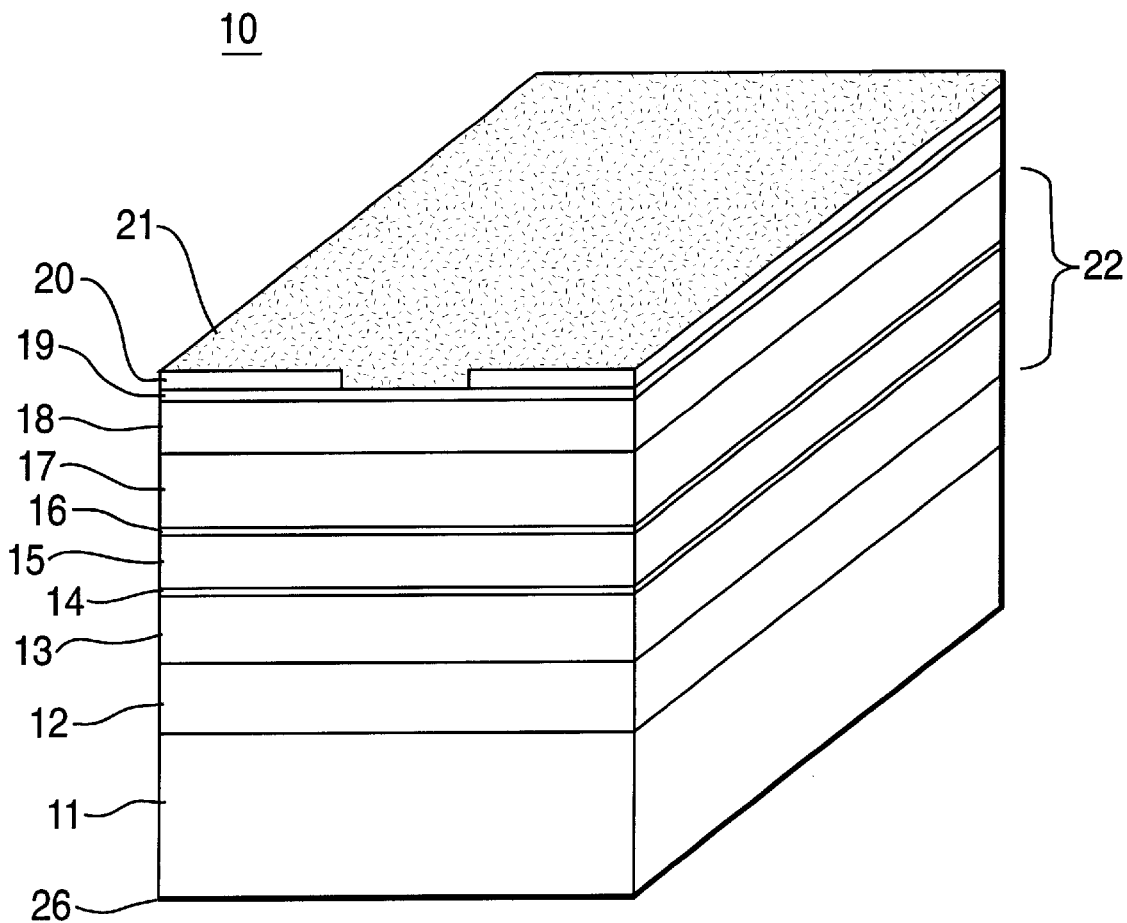
FIG. 1 is a perspective view of one form of a semiconductor laser constructed in accordance with the present invention.

In FIG. 1, a semiconductor laser, generally designated as 10, comprises a substrate 11 of a semiconductor material. An optional buffer layer, not shown, may be deposited on substrate 11 and may be of the same semiconductor material as that of the substrate 11. This buffer layer may be employed to provide a substantially defect free surface on which to form the remaining layers. Such layer formation is well known to those skilled in the art, and may be, for example, by molecular beam epitaxy (MBE) or metal organic chemical vapor deposition (MOCVD). Upon substrate 11 is formed a first cladding layer 12, which may be an n-cladding layer. Semiconductor laser 10 includes a waveguide region 22 formed between the first cladding layer 12 and a second cladding layer 18. Second cladding layer 18 may be of the same material as the first cladding layer 12 and may be a p-cladding layer. First and second cladding layers 12 and 18 are at least partially doped to be of opposite conductivity type, typically between $5 \times 10^{17}/cm^3$ and $2 \times 10^{19}/cm^3$. First and second cladding layers 12 and 18 may be doped uniformly or may have graded doping. Waveguide region 22 between the first cladding layer 12 and the second cladding layer 18 may be an undoped waveguide region having an active region of at least two quantum wells 14 and 16 formed therein.

While specific substrate materials for substrate 11 are described herein, as is known in the art such substrates may be selected from many various compounds. Further, a selected substrate material may determine available compounds which may be employed for the various layers or regions of the diode laser. Consequently, the present invention is described for embodiments formed on substrate materials as commonly used in industry; however, as would be apparent to one skilled in the art, the present invention is not so limited by these described compositions for substrate and layer/region materials.

As shown in FIG. 1, the waveguide region 22 includes undoped waveguide portions 13, 15 and 17. Each pair of undoped waveguide portions 13 and 15 and waveguide portions 15 and 17 have respective quantum wells 14 and 16 formed therebetween. Quantum wells 14 and 16 are formed in accordance with the present invention as highly-strained quantum wells in a manner as described subsequently. The undoped waveguide portion 13 is on the first cladding layer 12, undoped waveguide portion 15 provides a barrier region between quantum wells 14 and 16, and the undoped waveguide portion 17 is below and in contact with the second cladding layer 18.

Although the exemplary embodiment of the semiconductor laser 10 of FIG. 1 is shown having two quantum wells, the present invention is not so limited, and may have three or more quantum wells. Substrate layer 11 and first and second cladding layers 12 and 18 are formed as is generally known in the art. Typically, substrate layer 11 may have a thickness of approximately 100 $\mu$m, and first and second cladding layers 12 and 18 each may have a thickness of approximately 2 $\mu$m. In accordance with a preferred embodiment of the present invention, undoped waveguide portions 13, 15 and 17 have respective thicknesses of approximately 0.4 $\mu$m, 0.2 $\mu$m and 0.4 $\mu$m, and quantum wells 14 and 16 have each have a respective thickness of approximately 10–20 nanometers (nm). However, waveguide region 22 is generally formed having a thickness between of about, for example, 0.7 and 1.3 $\mu$m, and respective thicknesses of waveguide portions 13, 15 and 17 may vary accordingly. A laser having such thick waveguide region, such as those of approximately 1 $\mu$m, may be defined as a broad waveguide separate confinement diode laser.

As is known in the art, compositions of waveguide portions may be graded to increase performance. Also, as is known in the art, diode laser performance may be increased by coating a front surface 30 of the diode laser 10 with an anti-reflection coating and coating a back surface 31 of the diode laser 10 with a highly reflective coating or dielectric mirror.

For the structure of the semiconductor laser 10 of FIG. 1, for example, a process to select the material composition for the waveguide and quantum wells in accordance with the present invention is now described. The thickness of the waveguide region in separate confinement heterostructure (SCH) lasers is desirably about 1-$\mu$m, and this thickness may allow a laser structure to have separate, highly-strained quantum wells. Therefore, quantum wells 14 and 16 in accordance with the present invention are located at a distance from each other and from the first and second cladding layers 13 and 17, which distance is significantly larger than the quantum well thickness h. The inventors have determined through an estimation process that this laser structure allows that a wider range of ternary material compositions without lattice misfit problems may be used as quantum well material than currently employed in the prior art. Highly-strained quantum wells are defined as quantum wells formed in waveguide regions having a strain of the crystal lattice being greater than 1%.

Estimating the dependence of the critical thickness and misfit dislocation density on the distance between quantum wells may be accomplished with a modified version of Matthews theory. As before, from calculations derived by Matthews and Blakeslee, one can find the critical value of the product $(f*h)_{crit}$, where h is, as before, the quantum well thickness, and f is a lattice mismatch between quantum well and waveguide portion, and the value of f providing $(f*h)_{crit}$ is defined as $f_{crit}$.

Figure 2:
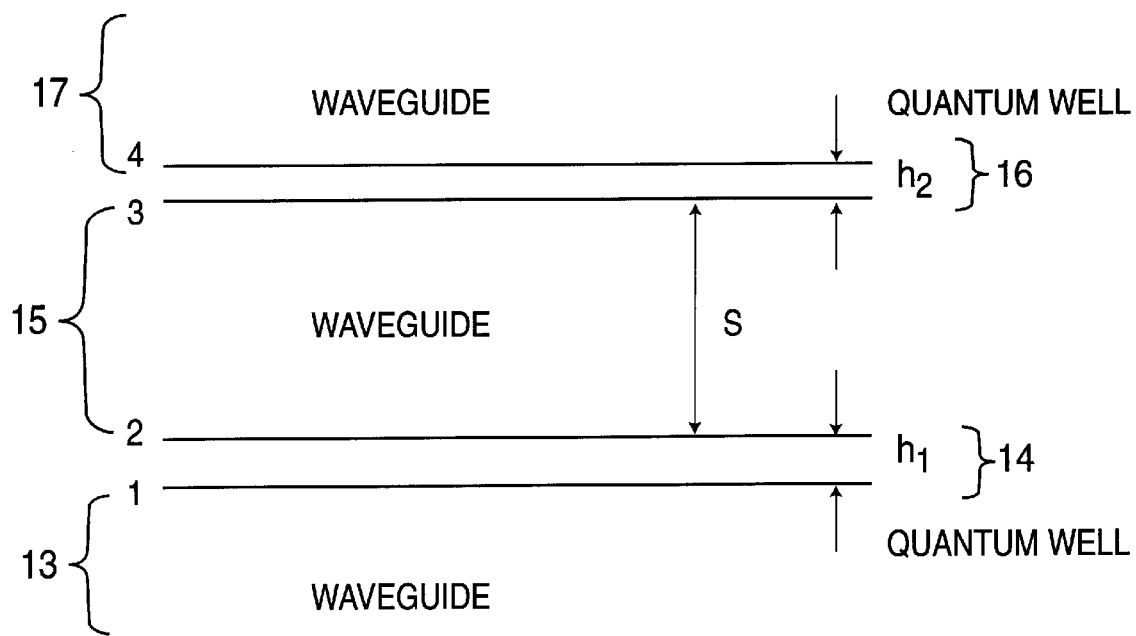
FIG. 2 illustrates a semiconductor structure for which a critical strain estimation calculation is performed in accordance with an exemplary embodiment of the present invention.

The following estimations herein are performed assuming that the value $f_{crit}$ and the density of the misfit dislocations generated if $f > f_{crit}$ may be determined by the condition of the minimum energy in a quantum wells/waveguide region system. Thus, only the equilibrium states of this system need be considered, and the influence of growth conditions and other kinetic phenomena may be neglected. FIG. 2 illustrates a semiconductor structure for which a critical strain estimation calculation is performed in accordance with an exemplary embodiment of the present invention. Two quantum wells 14 and 16 with thickness $h_1$ (between interfaces 1 and 2) and $h_2$ (between interfaces 3 and 4) are inserted in the wider band gap of waveguide portions 13 and 17 of a waveguide region 22 assumed to have infinite thickness. Also, the thicknesses $h_1$ and $h_2$ of quantum wells 14 and 16 are desirably equal and denoted as h. The distance between quantum wells is denoted as S.

Figure 3:
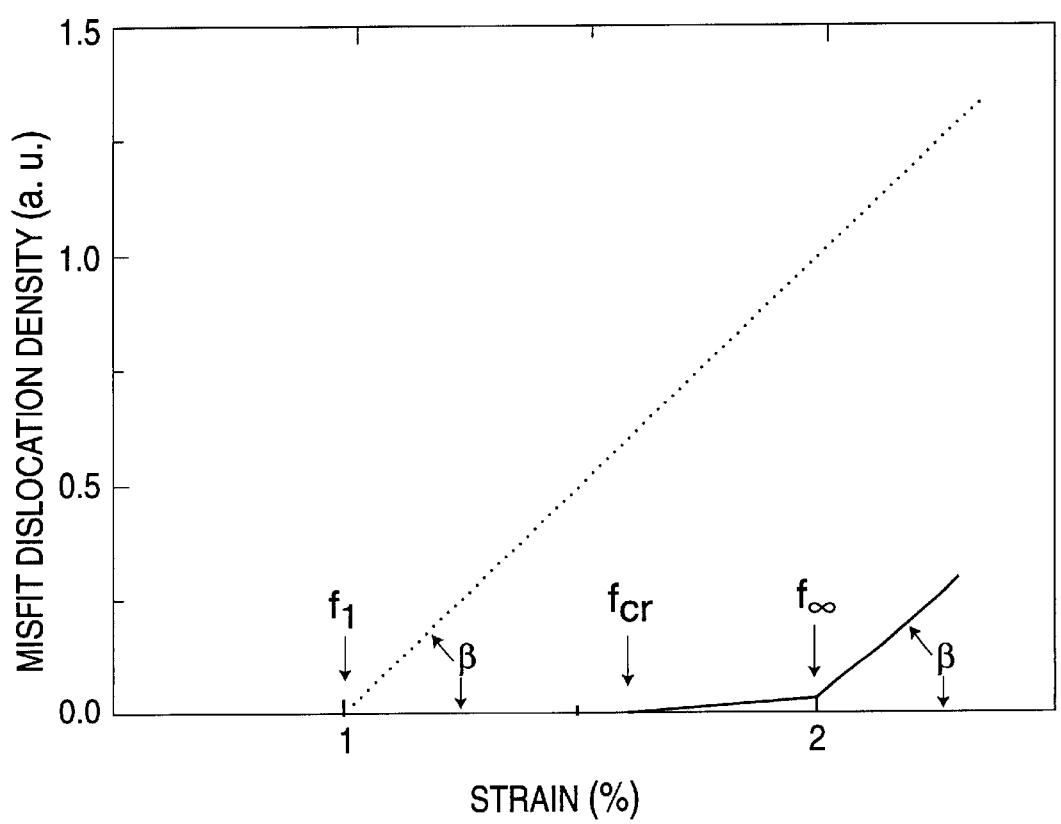
FIG. 3 is a graph showing density of misfit dislocation plotted as a function of strain for two quantum wells having 10-nm thickness located as shown in FIG. 2.

FIG. 3 is a graph showing density of misfit dislocations (shown in arbitrary units) plotted as a function of strain f, (shown as lattice misfit in percent (%)) for two, 10 nm-thick quantum wells located as shown in the exemplary embodiment of FIG. 2. The dashed line indicates calculated values of misfit dislocation density for the same quantum wells located close to each other at the distance $S = S_1 \leq h$ and the solid line indicates calculated values of quantum wells of similar composition separated by $S = S_2 \cong 10*h$. The strain, denoted as f, is directly related in percentage lattice misfit between quantum well ternary material and waveguide material. In FIG. 3, when quantum wells of similar composition are separated by waveguide portions having a thickness approximately equivalent to 10 times the thickness of the quantum well, acceptable strain may be achieved for many ternary materials, thus allowing more In content, for example, to be used. Higher In content, in turn, permits the semiconductor laser 10 to operate at longer wavelengths.

Critical strain for two, 10-nm quantum wells separated by waveguide portions of approximately the same thickness as the quantum wells is approximately equal to 1% and this point is marked as $f_1$ on FIG. 3. The critical strain for two 10 nm quantum wells separated by waveguide portions having greater thickness by a factor of 10 (S=100 nm, h=10 nm), the critical strain is approximately equal to 1.6% and this point is marked as $f_{cr}$ on FIG. 3. The critical strain for a single 10 nm quantum well is equal to 2% and this point is marked as $f_{2S}$ on FIG. 3 because this same strain value would be critical strain for two quantum wells separated by a waveguide portion of infinite thickness for the case of $S = S_3 = \infty$. As expected for adjacent quantum wells, the critical strain value at $f_1 \cong 0.5~f_\infty$. At the strains exceeding the critical values of $f_1$ and $f_\infty$ the dislocation density increases with f at the same rate, given by $\text{Tan}[\beta]$, for both quantum well cases in FIG. 3.

From these calculations, the inventors have determined that, as the value of S increases, the values of critical strain, $f_{cr}$, increase proportionally to $1 + C_o \ln(S/h)$, where $C_o$ is a constant dependent on crystal parameters. In addition, in the range of strain between $f_{cr}$ and $f_\infty$, the rate of the dislocation density increase with f is slower than the initial slope $\text{Tan}[\beta]$ by the factor S/h (FIG. 3). Summarizing, a tolerable strain for spatially separated quantum wells having separation such as $S_2$ is almost twice as large than that for similar, adjacent quantum wells having small separation such as $S_1$. Consequently, in a semiconductor laser 10, as shown in FIG. 1, it is desirable to separate the quantum wells 14 and 16 by a separation distance S significantly greater than the thickness of each quantum well. This separation distance between quantum wells 14 and 16 may be greater than the thickness of each quantum well by a factor of two, and, desirably, this separation distance S should be greater by a factor of 10.

For example, traditional prior art lasers, such as GaAs—or InP-based lasers may operate in a near-infrared wavelength range and have two quantum wells of ternary material, such as InGaAs quantum wells. An upper content limit of In content may be doubled over that in lasers of the prior art, leading to an expansion of operating wavelength, when the two quantum wells are separated in accordance with the laser structure of the present invention.

For the first exemplary embodiment operating in the near-infrared wavelength range, the semiconductor laser 10 of FIG. 1 comprises a substrate 11 of a semiconductor material such as GaAs or InP. The first cladding layer 12 may be an n-cladding layer of, for example, InGaP or AlGaAs for GaAs substrate material or InP or AlInAs for InP substrate material. Second cladding layer 18 may be of the same material as the first cladding layer 12, which may be a p-cladding layer of, for example, InGaP for GaAs substrate material or InP for InP substrate material. The contact layer 19 and electrical isolation layers may be, for example, of GaAs and $SiO_2$ material, respectively. Undoped waveguide portions 13, 15 and 17 are formed from a material such as AlGaAs or AlGaAsP for GaAs substrate material or InGaAsP or AlGaInAs for InP substrate material. Quantum wells 14 and 16 are formed from a ternary material which may be of the form InGaAs for GaAs or InP substrate material. This construction may lead, for example, to the extension of the laser operation range on the long wavelength side by 0.1–0.2 $\mu$m, thus providing $\mu = 1.2$–$1.3$-$\mu$m for GaAs-based lasers and 2.1–2.2-$\mu$m for InP-based lasers.

A new class of semiconductor lasers operating in the mid to upper infrared wavelength range and formed in accordance with the present invention is in now described. A second exemplary embodiment of the present invention employs ternary or "quasi-ternary" InGaAsSb compositions in which a miscibility gap does not exist. The term "quasi-ternary" implies quaternary compounds in which the concentration of one of the V-group elements is considerably higher than that of the other V-group element. In the range of reasonable strain, these quasi-ternary compounds permit the extension of laser operation to the wavelengths of 2.2–4 μm. A broad waveguide design with spatially separated quantum wells such as that given in FIG. 1 may be used for these lasers. For the second exemplary embodiment of the present invention, a semiconductor structure such as that given in FIG. 1, may be employed for lasers, such as GaSb— or InAs-based lasers, with highly-strained ternary compounds, such as GaInSb or GaInAs, or quasi-ternary compounds, such as GaInSb(As) or GaInAs(Sb), as materials employed for quantum wells.

For this second exemplary embodiment operating in a mid-infrared wavelength range, the semiconductor laser 10 of FIG. 1 comprises a substrate 11 of a material such as GaSb and InAs. The first cladding layer 12 may be an n-cladding layer of, for example, $Al_{0.95}Ga_{0.05}As_{0.08}Sb_{0.92}$. Second cladding layer 18 may be of the same material as the first cladding layer 12, and may be a p-cladding layer of, for example, $Al_{0.95}Ga_{0.05}As_{0.08}Sb_{0.92}$. The contact layer 19 and electrical isolation layers may be, for example, of GaSb and $SiO_2$ material, respectively. Undoped waveguide portions 13, 15 and 17 are formed from a quaternary material that may be of $Al_{0.25}Ga_{0.75}As_{0.02}Sb_{0.98}$. Quantum wells 14 and 16 are formed from a quaternary material which may be of the form $Ga_xIn_{1-x}As_{0.03}Sb_{0.97}$. For one case of the second exemplary embodiment constructed as shown in FIG. 1, a design for mid-infrared quantum well diode lasers such as semiconductor laser 10 leads to continuous wave (CW) operation of 2.0–3.0-μm devices at temperatures as high as 100° C. The designs for semiconductor laser 10 may be extended, however, for quantum well diode laser devices so as to operate from 1.0 to 2.0-μm.

In the exemplary embodiment of the present invention, a study of 2-μm GaInAsSb/AlGaAsSb lasers reveals that $Al_xGa_{1-x}As_ySb_{1-y}$ waveguide regions with Al compositions as low as 30% provide efficient carrier confinement in GaInAsSb quantum wells. Such compositions are reviewed in D. Garbuzov, R. Menna, H. Lee, R. U. Martinelli, J. C. Connolly, L. Xu, S. R. Forrest, Conference on InP and Related Compounds, Hyannis, Mass., May, 11, 1997, 551–555, which is incorporated herein by reference for its teachings of such compositions.

Broad waveguide (BW)-SCH lasers emitting at 2 μm that are 1% compressively strained and containing an undoped waveguide region about 0.9 μm in thickness may employ compositions known in the art. For example, 2-μm InGaAsSb lasers that are 1% compressively strained, $Ga_{0.83}In_{0.17}Sb_{0.98}As_{0.02}$ quantum wells may be employed in the BW-SCH structure.

In order to achieve longer emission wavelengths while still maintaining 1% strain in the $Ga_{1-x}In_xSb_yAs_{1-y}$ quantum well active region, the compositional values for both In and As are desirably increased simultaneously. However, at wavelengths, λ, exceeding λ>2.1 μm, performance of such devices may be degraded, since quantum well material quality degrades rapidly as the miscibility gap is approached. As described previously, elimination of material quality degradation associated with the miscibility gap is accomplished by adjusting the composition and strain of the quantum wells.

Figure 4:
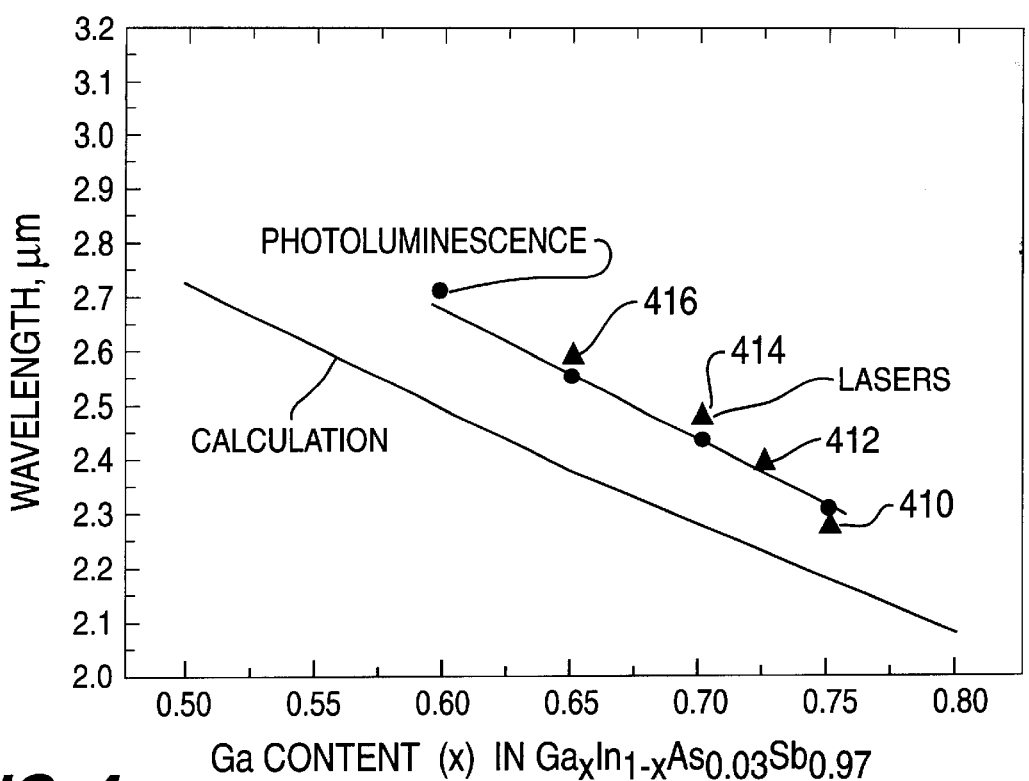
FIG. 4 shows wavelength-/composition dependency characteristics for elastically strained GaInAs(Sb) quantum wells having 20-nm thickness grown on a GaSb substrate in accordance with another exemplary embodiment of the present invention.
Figure 5:
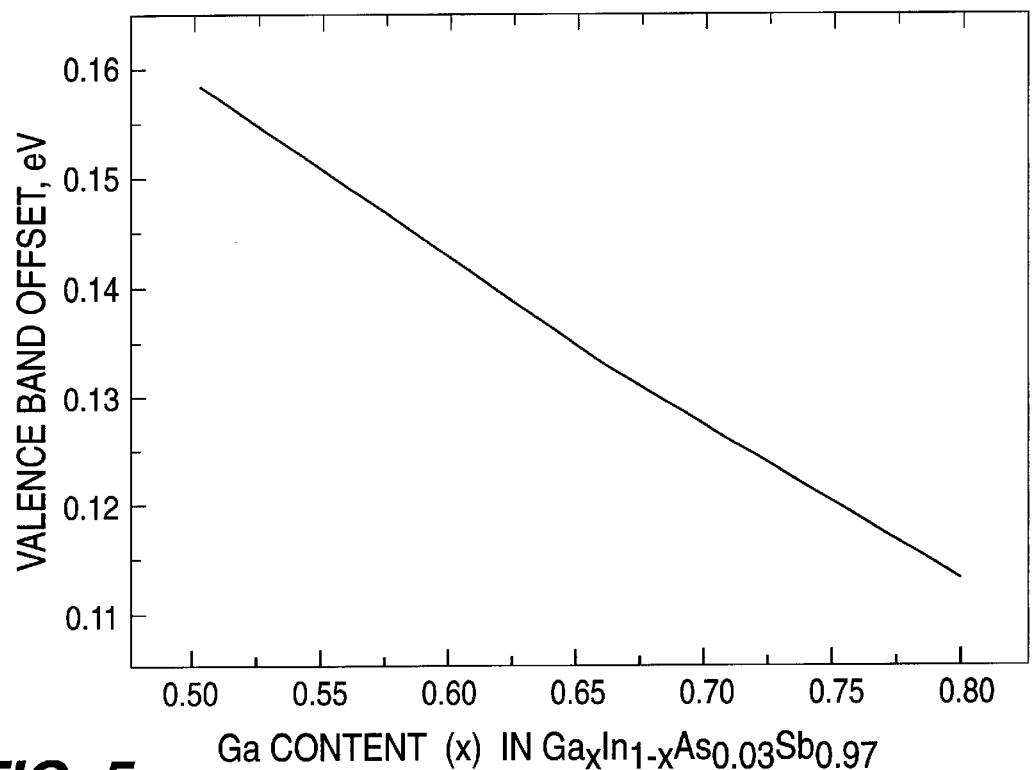
FIG. 5 illustrates alignment of valence bands between $Ga_xIn_{1-x}As_{0.03}Sb_{0.97}$ quantum wells and $Al_{0.25}Ga_{0.75}As_{0.02}Sb_{0.98}$ barriers for the exemplary embodiment of the present invention.

Quasi-ternary GaInSb (As) quantum wells grown on a GaSb substrate may be preferred for lasers operating in the wavelength range of 2–2.7-μm. Wavelength-composition dependence for quantum wells of 20-nm thickness prepared from $Ga_xIn_{1-x}As_{0.03}Sb_{0.97}$, is shown in FIG. 4. For this first case of the second exemplary embodiment, $Al_{0.25}Ga_{0.75}As_{0.02}Sb_{0.98}$ is employed as a waveguide material and $Al_{0.9}Ga_{0.1}As_{0.07}Sb_{0.93}$ is employed as a cladding layer in the laser semiconductor structure. These structures in accordance with the present invention provide very good carrier confinement (as shown in FIG. 5) and optical confinement.

FIG. 4 illustrates wavelength dependencies as a function of composition for elastically strained GaInAsSb quantum wells of 20-nm thickness grown on a GaSb substrate. In FIG. 4, the lower solid line 601 shows calculated wavelength; solid circles denote experimental data points achieved on photoluminescence peak position; and triangles 410, 412, 414 and 416 denote wavelength, λ, for diode lasers fabricated from second exemplary semiconductor structures having In content of $In_{0.25}$, $In_{0.275}$, $In_{0.3}$, and $In_{0.35}$, in quantum well respectively. FIG. 5 illustrates the valence band offset between $Ga_xIn_{1-x}As_{0.03}Sb_{0.97}$ quantum wells and undoped waveguide regions of $Al_{0.25}Ga_{0.75}As_{0.02}Sb_{0.98}$.

A semiconductor diode laser in accordance with the present invention operated in a CW manner at room temperature may achieve a radiation emission wavelength of between 2.3-μm and 2.7-μm. As shown in Table 1, diode lasers may achieve reasonably high output power $P_{max}$ emitting between 2.3-μm and 2.6-μm when operating with very low current thresholds $J_{th}$. The exemplary values as given in Table 1 are of a CW operated diode laser with 100-μm wide contact stripe operating at 15° C.

TABLE 1

| In content | 0.25 | 0.275 | 0.30 | 0.35 | 0.38 |
|---|---|---|---|---|---|
| Wavelength (μm) | 2.3 | 2.4 | 2.5 | 2.6 | 2.7 |
| $J_{th}$ (A/cm$^2$) | 230 | 250 | 360 | 400 | 600 |
| $P_{max}$ (CW, mW) | 500 | — | 250 | 160 | 30 |

Figure 6:
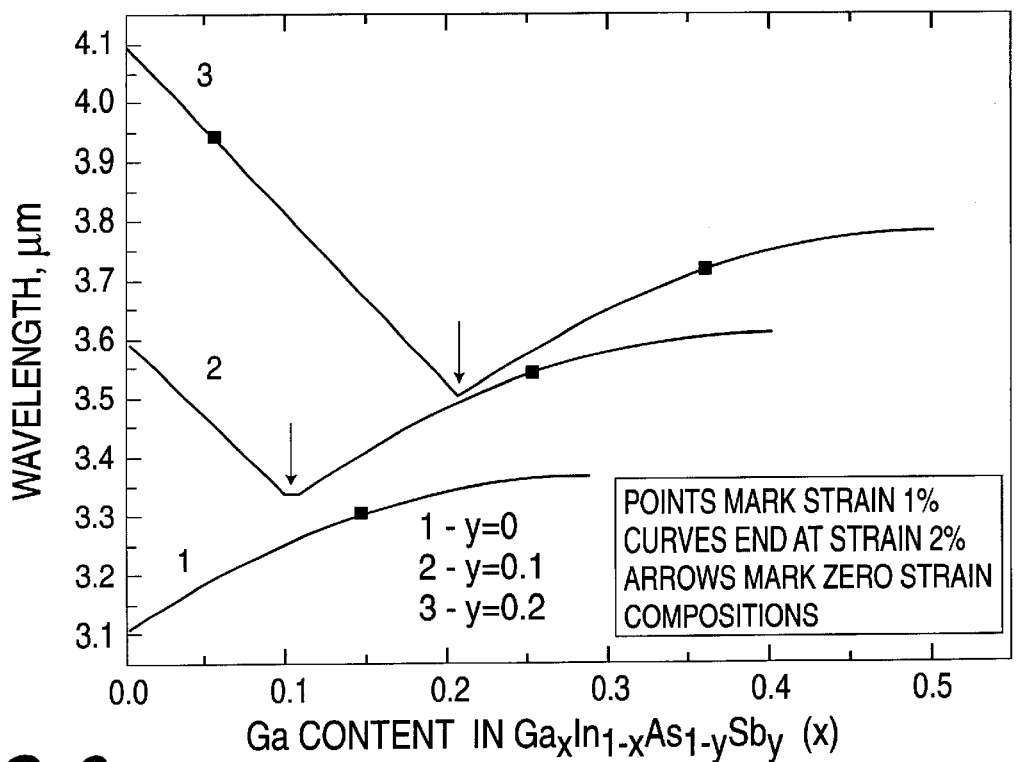
FIG. 6 shows wavelength-composition dependency characteristics for elastically strained GaInAs(Sb) quantum wells having 20-nm thickness grown on an InAs substrate in accordance with an exemplary embodiment of the present invention.

FIG. 6 shows wavelength-composition dependencies for elastically strained quasi-ternary GaInAs(Sb) quantum wells of 20-nm thickness grown on InAs in accordance with another case of the exemplary secondary embodiment of the present invention. Wavelength ranges covered using quasi-ternary compounds of $Ga_xIn_{1-x}As_{1-y}(Sb_y)$, y<<1–y, as a material for quantum wells of 20-nm thickness are shown in FIG. 6. Calculations for structures in accordance with the present invention grown on InAs substrates, and for compounds with less than 2% mismatch show that wavelengths as long as 4 μm are available with these quasi-ternary compounds considered, and none of the corresponding compositions falls within the miscibility gap.

Figure 7:
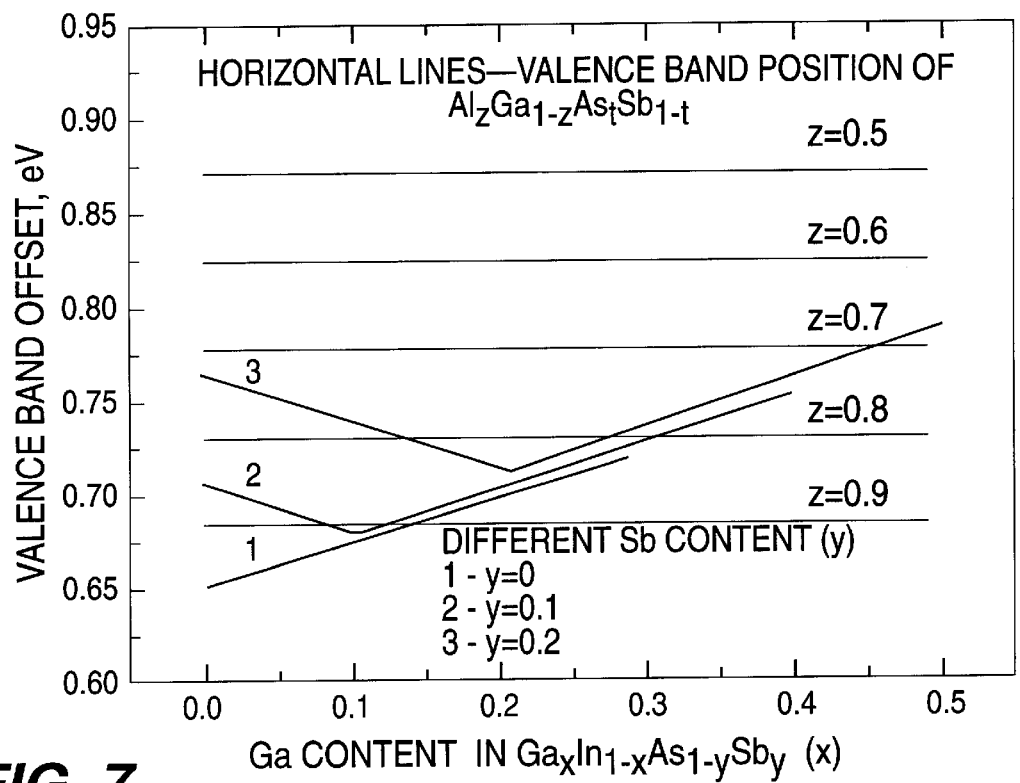
FIG. 7 illustrates alignment of valence bands between InGaAs(Sb) quantum wells and AlGaAsSb barriers for the compositions of FIG. 4.

AlGaAsSb compositions with Al contents higher than 60% may be considered as the waveguide and cladding materials for these 4 μm lasers. At the interfaces with $Ga_xIn_{1-x}As_{1-y}(Sb_y)$ quantum wells, these wide-bandgap materials form very high barriers in the conduction band of the semiconductor laser, and thereby these wide-bandgap materials have excellent electron confinement. However, hole confinement for 4 μm long wavelength lasers is poor. FIG. 7 illustrates alignment of valence bands between GaInAs(Sb) quantum wells and AlGaAsSb barriers, demonstrating the positions of valence bands for AlGaAsSb with different Al contents in comparison with that for quantum well materials considered in FIG. 6.

Consequently, a preferred semiconductor laser 10 of the second exemplary embodiment of the present invention employs $Al_{0.7}Ga_{0.3}As_{0.14}Sb_{0.86}$ as a waveguide material and $Ga_xIn_{1-x}As_{0.8}Sb_{0.2}$ as a quantum well material. A small (~<2KT) negative offset for the holes may be overcompensated by attractive Coulomb potential formed by the electrons confined in the quantum wells. In combination with first and second cladding layers 12 and 18 of $Al_{0.9}Ga_{0.1}As_{0.155}Sb_{0.845}$, a waveguide region 22 of $Al_{0.7}Ga_{0.3}As_{0.14}Sb_{0.86}$ forms an effective waveguide and provides high overlap between lasing mode and quantum wells. According to one estimation, for two quantum wells of 20-nm thickness sandwiched in 1.5-μm thick waveguide layer, the optical confinement factor may be about 2.0–2.4% for a laser operating in the wavelength range 3–4-μm.

Figure 8:
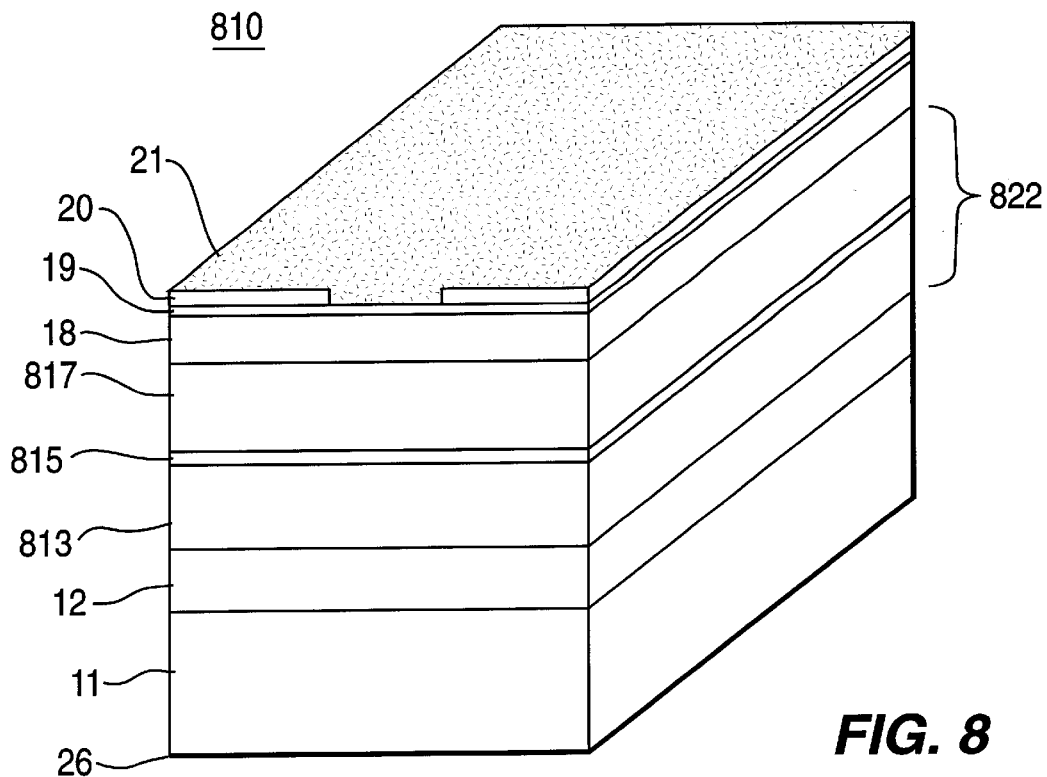
FIG. 8 is a perspective view of another form of a semiconductor laser constructed in accordance with a third exemplary embodiment of the present invention.

In addition, single quantum well devices, known in the art, may have increased performance when constructed in accordance with the present invention using strained ternary or quasi-ternary compounds. As an illustration, a third exemplary embodiment of a semiconductor laser 810 in accordance with the present invention is shown in Figure. 8. For the third exemplary embodiment of FIG. 8, highly-strained ternary or quasi-ternary compounds are used for a single quantum well and a waveguide region 822 has a thickness of approximately 1-$\mu$m. These highly-strained ternary or quasi ternary compounds are the same as those previously described for the second exemplary embodiment. The semiconductor laser 810 may have increased performance compared with, for example, laser structures of the prior art employing a single quantum well made from quaternary compounds which are lattice matched.

Semiconductor laser 810 employs a structure similar to that of the semiconductor laser 10 illustrated and described with respect to FIG. 1, but differs from the structure of FIG. 1 in that only one quantum well is present. For the FIG. 8, substrate 11 cladding layers 12 and 18, contact layer 19, isolation layer 20 and metal contact 21 are as described with respect to FIG. 1. However, semiconductor laser may be implemented having a waveguide region 822 having only one quantum well 815 disposed between waveguide portions 813 and 817. Waveguide region 822 is typically an undoped waveguide having a thickness between 0.7 and 1.3-$\mu$m, and quantum well 815 has a thickness of approximately 10–20 nm. In accordance with the present invention, waveguide portions 813 and 817 have a thickness greater than the thickness of quantum well 815 by approximately a factor of 10. Substrate 11 may be GaSb or InAs, and quantum well 815 is formed from highly-strained ternary or quasi-ternary compounds with composition outside the miscibility gap, such as a $Ga_xIn_{1-x}As_zSb_{1-z}$ compound.

Many different types of semiconductor laser devices may be constructed using separated, highly-strained ternary quantum wells or quasi-ternary quantum wells in accordance with the present invention. For example, broad contact, multimode lasers may be constructed. Also, single mode lasers may be constructed, such as index guide (ridge-waveguide), distributed feedback (DFB) and Bragg reflector lasers. Further, broad contact or DFB lasers may be integrated into multi-element devices having several electrically isolated sections. Master oscillator power amplifier lasers, external cavity lasers, grating and mode locked lasers may also be constructed in accordance with the present invention.

Returning to FIG. 1, the exemplary semiconductor laser 10 in accordance with the present invention is further described having a wide contact stripe configuration constructed as employed in multimode diode lasers. Referring to FIG. 1, the wide contact stripe is employed to enable operation of the semiconductor laser 10; however, as is known in the art, other similar structures may be employed. The contact stripe is formed upon the second cladding layer 18 in the following manner. A contact layer 19, which may be a p+ contact layer of approximately 0.2 $\mu$m thickness, is formed on second cladding layer 18 and an electrical isolation layer 20 of approximately 0.1 $\mu$m is formed on the contact layer 19. The contact layer 19 may be, for example, of the same material as employed in the substrate 11. A stripe exposing the contact layer 19 is then formed in the isolation layer 20 by a technique such as etching, and this stripe may typically be of 100–200 $\mu$m width. A metal contact 21 of approximately 0.1 $\mu$m is deposited on the electrical isolation layer 20 and on and in ohmic contact with exposed contact layer 19 to provide a first terminal, and this metal contact 21 may be Ti, Pt or Au. Further, a bottom surface of substrate 11 opposite to the first cladding layer 12 is mounted on and in ohmic contact with a second metal surface 26, which may be an n-contact layer of Au—Ge, Ni or Au, to provide a second terminal, a voltage potential being applied across the first and second terminals to operate semiconductor laser 10. To increase performance, the exemplary semiconductor laser 10 may be mounted p-side down onto copper heatsinks using In solder.

Figure 9:
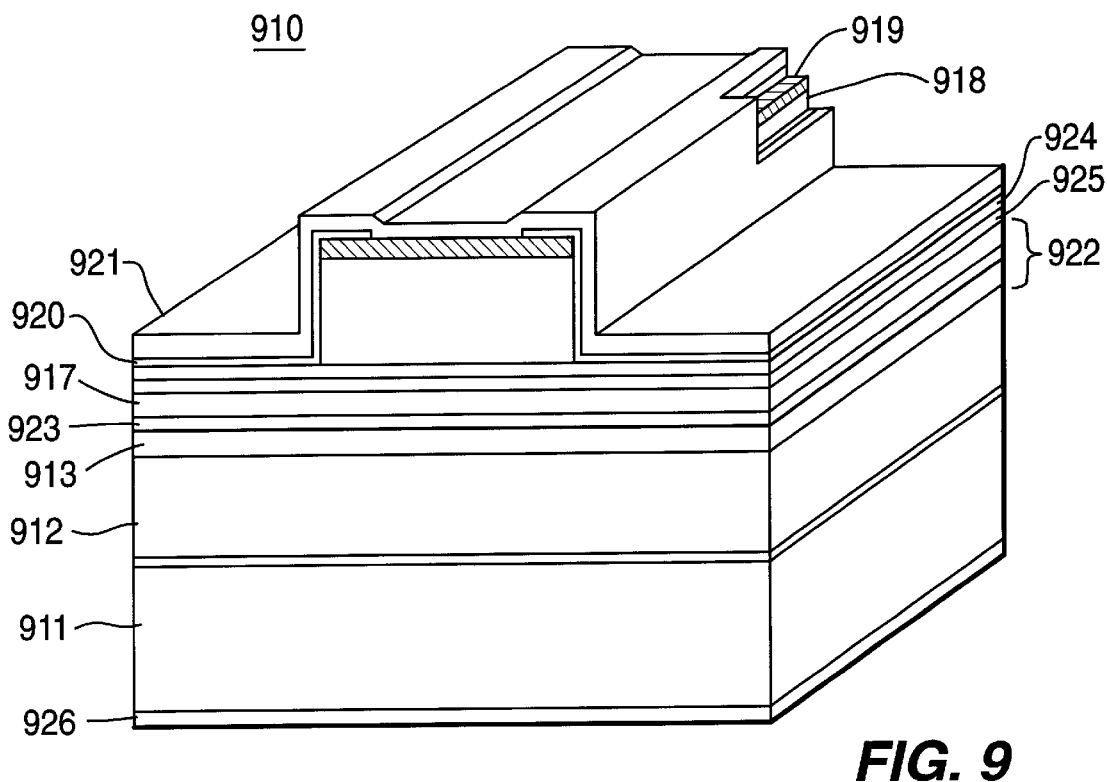
FIG. 9 is a perspective view of an alternative form of a semiconductor laser shown in FIG. 1 constructed in accordance with the present invention.

FIG. 9 illustrates an alternative semiconductor laser 910 in accordance with the present invention employed for single mode applications. Upon substrate 911 is formed a first cladding layer 912, which may be an n-cladding layer. Semiconductor laser 910 includes a waveguide region 922 formed between the first cladding layer 912 and a second cladding layer 18 in a similar manner to that described with reference to FIG. 1. Waveguide region 922 between the first cladding layer 912 and the second cladding layer 918 may be an undoped waveguide region having an active region 923 of quantum wells and undoped waveguide portions formed therein. As shown in FIG. 9, the waveguide region 922 includes at least two undoped waveguide portions 913 and 917, also referred to as confinement layers. Quantum wells in active region 923 are formed in accordance with the present invention as highly-strained quantum wells in a manner as described previously. For purposes of forming a narrow contact stripe, described subsequently, an etch stop layer 924 and optional spacer layer 925 may be formed between undoped waveguide portion 917 and second cladding layer 918.

For the exemplary embodiment shown in FIG. 9, a narrow contact stripe is constructed as employed in single mode diode lasers. For the alternate embodiment shown in FIG. 9, this narrow contact stripe is similarly employed to enable operation of the semiconductor laser 910. The narrow contact stripe is formed in the following manner. First, an optional spacer layer 925, which may be of 0.1 $\mu$m, may be formed on the undoped waveguide portion 917 to avoid growth defects. Then an etch stop layer 924 is formed either on the undoped waveguide portion 917 or optional spacer layer 925. A second cladding layer 918 is formed on the etch stop layer 924 and contact layer 919, which may be a p+ contact layer of approximately 0.2 $\mu$m thickness, is formed on the second cladding layer 918. This contact layer 919 and second cladding layer 918 is etched to expose the form a narrow ridge, which may be 3–5 $\mu$m wide, and expose the etch stop layer 924 on either side of the narrow ridge.

An electrical isolation layer 920 of approximately 0.1 $\mu$m is formed on the etched contact layer 919, second cladding layer 918, and exposed etch stop layer 924. The contact layer 919 may be, for example, of the same material as employed in the substrate 911. A stripe exposing the contact layer 919 is then etched into the isolation layer 920, and this stripe may typically be of 1–3 $\mu$m width. A metal contact 921 of approximately 0.1 $\mu$m is deposited on the electrical isolation layer 20 and on and in ohmic contact with exposed contact layer 19 to provide a first terminal, and this metal contact 21 may be Ti, Pt or Au. Further, a bottom surface of substrate 911 opposite to the first cladding layer 12 is mounted on and in ohmic contact with a second metal surface 926, which may be an n-contact layer of Au—Ge, Ni or Au, to provide a second terminal, a voltage potential being applied across the first and second terminals to operate semiconductor laser 910. To increase performance, the exemplary semiconductor laser 910 may be mounted p-side down onto copper heatsinks using In solder.

Thus, there is provided a semiconductor diode laser including highly-strained compounds for each quantum well and having waveguide portions between the quantum wells with thickness chosen to be considerably greater than that of the quantum well while maintaining acceptable critical strain. For such waveguide portions of the preferred embodiments, the thickness of each waveguide portion may be greater than the thickness of the quantum well by a factor of about 10. Although the devices are illustrated and described herein with reference to certain specific embodiments, the present invention is nevertheless not intended to be limited to the devices shown. Rather, it is understood that various modifications may be made to the devices by those skilled in the art within the scope and range of equivalents of the claims and without departing from the spirit of the invention.

What is claimed is:

1. A semiconductor laser having at least two highly-strained quantum wells, each quantum well disposed between a pair of waveguide portions, wherein each highly-strained quantum well is 1) separated from each other highly strained quantum well by a waveguide portion having a thickness greater than the thickness of either highly-strained quantum well by at least a factor of ten, and 2) formed of either a ternary or quasi-ternary compound, wherein the highly-strained quantum wells ad the waveguide portions from a waveguide region having a thickness of at least 0.7 $\mu$m, and wherein:

an operating wavelength of the laser having been selected by adjusting an element of the compound and by adjusting a strain of each highly-strained quantum well to a value substantially greater than 1% to avoid its miscibility gap.

2. The laser as recited in claim 1, wherein the thickness of each waveguide portion is at least one order of magnitude larger than the thickness of the quantum well.

3. The laser as recited in claim 1, wherein the laser is formed on a substrate of either GaAs or InP, and each quantum well of the laser is a ternary compound selected of either InAsP or GaInAs.

4. The laser as recited in claim 1, wherein the laser is formed on a substrate of either GaSb or InAs, and each quantum well of the laser is a ternary compound of either GaInSb or GaInAs.

5. The laser as recited in claim 1, wherein the laser is formed on a substrate of either GaSb or InAs and each quantum well of the laser is a quasi-ternary compound of either GaInSb(As) or GaInAs(Sb).

6. The laser as recited in claim 5, wherein the quasi-ternary compound is $GaInAs_zSb_{1-z}$, wherein z<0.2 or z>0.8.

7. The laser as recited in claim 6, wherein the at least two quantum wells and corresponding pairs of waveguide portions for the at least two quantum wells form a waveguide region, the waveguide region having a thickness of between 0.7 and 1.3 $\mu$m.

8. The laser as recited in claim 1, wherein the laser is a broad waveguide separate confinement diode laser.

9. The laser as recited in claim 8, wherein each quantum well and corresponding pair of waveguide portions for each quantum well form a waveguide region, the waveguide region having a thickness of between 0.7 and 1.3 $\mu$m.

10. The laser as recited in claim 1, wherein each quantum well forms an active region, and the laser further comprises first and second opposed portions, one having a first contact layer formed on a cladding layer, the other having a cladding layer formed on a substrate and the substrate in ohmic contact with a second contact layer, wherein the active region and pair of waveguide portions are disposed between the cladding layers of the first and second opposed portions, the laser operating by a current applied between the first and second contact layers so as to emit a radiation of a predetermined wavelength.

11. The laser as recited in claim 10, wherein the first contact layer is formed on the cladding layer such that when the laser is operating, the laser emits spatial and frequency multi-mode radiation.

12. The laser as recited in claim 10, wherein the first contact layer is formed on the cladding layer such that, when the laser is operating, the laser emits single spatial mode radiation.

13. The laser as recited in claim 10, wherein the first contact layer is formed on the cladding layer such that, when the laser is operating, the laser emits single spatial mode and single frequency radiation.

14. The laser as recited in claim 10, wherein the laser operates having the radiation wavelength of between 1 $\mu$m to 3 $\mu$m.

15. A semiconductor laser having one highly-strained quantum well disposed between first and second waveguide portions, each waveguide portion having a thickness greater than a thickness of the highly-strained quantum well by at least a factor of ten, and a material for the highly-strained quantum well is either a ternary or quasi-ternary compound.

wherein the highly-strained quantum well and the waveguide portions form a waveguide region having a thickness of at least 0,7 $\mu$m, and wherein an operating wavelength of the laser having been selected by adjusting an element of the compound and by adjusting a strain of the highly-strained quantum well to a value substantially greater than 1% to avoid its miscibility gap.

16. The semiconductor laser as recited in claim 15 wherein the ternary compound is of either GaInSb or GaInAs or the quasi-ternary compound is $GaInAs_zSb_{1-z}$, wherein z<0.2 or z>0.8.

17. A broad waveguide, separate confinement diode laser having a waveguide region with at least two highly-strained quantum wells, each quantum well disposed between a first and second waveguide portions, and the laser characterized in that substantially all of a lasing mode emission of the laser propagates in the waveguide region with a free-carrier concentration of less than $10^{18}/cm^3$, wherein each highly-strained quantum well is separated from each other highly strained quantum well by a waveguide portion having a thickness greater than the thickness of either highly-strained quantum well by at least a factor of ten, and each highly-strained quantum well being either of a ternary compound or quasi-ternary compound, wherein the highly-strained quantum wells and the waveguide portions form a waveguide region having a thickness of at least 0.7 $\mu$m, and wherein:

an operating wavelength of the laser having been selected by adjusting an element of the compound and by adjusting a strain of the highly-strained quantum well to a value substantially greater than 1% to avoid its miscibility gap.

* * * * *